US009224950B2

(12) United States Patent
Wang

(10) Patent No.: US 9,224,950 B2
(45) Date of Patent: Dec. 29, 2015

(54) METHODS, SYSTEMS, AND APPARATUS FOR IMPROVING THIN FILM RESISTOR RELIABILITY

(71) Applicant: Intermolecular Inc., San Jose, CA (US)

(72) Inventor: Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/141,627

(22) Filed: Dec. 27, 2013

(65) Prior Publication Data

US 2015/0188046 A1 Jul. 2, 2015

(51) Int. Cl.
*H01L 47/00* (2006.01)
*H01L 45/00* (2006.01)
*H01L 27/24* (2006.01)

(52) U.S. Cl.
CPC .............. *H01L 45/145* (2013.01); *H01L 45/08* (2013.01); *H01L 45/12* (2013.01); *H01L 45/1233* (2013.01); *H01L 45/16* (2013.01); *H01L 27/2409* (2013.01); *H01L 27/2463* (2013.01); *H01L 27/2481* (2013.01)

(58) Field of Classification Search
CPC ... H04L 45/146; H04L 45/1233; H04L 45/08; H04L 27/2463; H04L 29/517; H04L 29/78; H04L 29/404; H04L 29/405; H04L 29/7835; H04L 29/402; H04L 29/408; H04L 29/0619; H04L 28/10; H04L 28/20; H04L 23/5227; H04L 27/0802; H04L 27/08; H04L 29/8605
USPC ........... 257/4, E21.004, E21.438, 2, E27.016, 257/E45.003, 154, 487, 489; 438/382, 381, 438/FOR. 429
See application file for complete search history.

(56) References Cited

U.S. PATENT DOCUMENTS

| 4,609,903 | A  | * | 9/1986  | Toyokura et al. .......... 338/22 SD |
| 5,804,523 | A  | * | 9/1998  | Oda et al. ...................... 501/97.2 |
| 5,965,942 | A  | * | 10/1999 | Itoh et al. ....................... 257/761 |
| 2002/0058186 | A1 | * | 5/2002 | Nozawa et al. .................... 430/5 |
| 2004/0023453 | A1 | * | 2/2004 | Xu et al. ....................... 438/202 |

(Continued)

FOREIGN PATENT DOCUMENTS

JP 2005175457 A 6/2005

OTHER PUBLICATIONS

Tirano, S., et al.; Accurate Analysis of Parasitic Current Overshoot During Forming Operation in RRAMs; Jan. 1, 2011; CEA-LETI, France; Microelectronic Engineering pp. 11291132.

(Continued)

*Primary Examiner* — Thao X Le
*Assistant Examiner* — Nduka Ojeh

(57) ABSTRACT

Provided are resistive random access memory (ReRAM) cells and methods of fabricating thereof. The ReRAM cells may include a first layer operable as a bottom electrode. The ReRAM cells may also include a second layer operable as a variable resistance layer configured to switch between at least a first resistive state and a second resistive state. The ReRAM cells may further include a third layer formed over the second layer. The third layer may have a substantially constant electrical resistivity. Moreover, the third layer may include a ternary metal-silicon nitride having a ratio of metal to silicon that is between about 1:1 and 1:4. Furthermore, the ternary metal-silicon nitride may include a metal that has an atomic weight that is greater than 90. The ReRAM cells may further include a fourth layer operable as a top electrode.

16 Claims, 5 Drawing Sheets

(56) References Cited

U.S. PATENT DOCUMENTS

| | | | |
|---|---|---|---|
| 2004/0188742 A1* | 9/2004 | Honma et al. | 257/303 |
| 2005/0110144 A1* | 5/2005 | Cabral et al. | 257/758 |
| 2007/0299274 A1* | 12/2007 | Meiere | 556/407 |
| 2008/0105920 A1* | 5/2008 | Hirano et al. | 257/327 |
| 2008/0144355 A1* | 6/2008 | Boeve et al. | 365/148 |
| 2009/0026434 A1* | 1/2009 | Malhotra et al. | 257/2 |
| 2009/0176040 A1* | 7/2009 | Chen et al. | 428/34.1 |
| 2011/0124174 A1* | 5/2011 | Park et al. | 438/382 |
| 2013/0037776 A1* | 2/2013 | Nishi et al. | 257/3 |
| 2013/0168817 A1* | 7/2013 | Kawahara et al. | 257/537 |

OTHER PUBLICATIONS

Guo, X., et al.; Tunneling Leakage Current in Oxynitride Dependence on OxygenNitrogen Content; Jun. 1, 1998; Yale University (New Haven, CT); IEEE Electron Device Letters vol. 19 No. 6 pp. 207209.

M. A Nicolet et al.; Highly metastable amorphous or nearamorphous ternary films mictamict alloys; Jan. 1, 2001; Z-Book—Elsevier; Microelectronic Engineering 55 2001 357367.

Angyal, M., et al.; Performance of Tantalumsiliconnitride Diffusion Barriers Between Cooper and Silicon Dioxide; Jan. 1, 1998; American Institute of Physics; Applied Physics Letters 4 pages.

Yoon-Jik Lee et al.; Barrier Properties and Failure Mechanism of TaSiN Thin Films for Cu Interconnection; Feb. 1, 1999; Journal of Applied Physics.

CK Chung et al.; Effect of SiTa and Nitrogen Ratios on the Thermal Stability of TaSiN Thin Films ; ; Elsevier Sequoia.

* cited by examiner

METHODS, SYSTEMS, AND APPARATUS FOR IMPROVING THIN FILM RESISTOR RELIABILITY

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells that may include resistive switching nonvolatile memory elements, and methods of fabricating thereof. The resistive switching nonvolatile memory elements may include a first layer disposed on a substrate. The first layer may be operable as a bottom electrode. The nonvolatile memory elements may also include a second layer disposed over the first layer. In some embodiments, the second layer may be operable as a variable resistance layer configured to switch between at least a first resistive state and a second resistive state. The nonvolatile memory elements may also include a third layer disposed over the second layer. In some embodiments, the third layer may have a substantially constant electrical resistivity. In some embodiments, the third layer may include a ternary metal-silicon nitride having a ratio of metal to silicon that is between about 1:1 and 1:4. The nonvolatile memory elements may also include a fourth layer disposed over the third layer. The fourth layer may be operable as a top electrode.

In some embodiments, the ratio of metal to silicon may be less than about 1:3. Moreover, the ternary metal-silicon nitride may include a metal of atomic weight greater than 90. In some embodiments, the ternary metal-silicon nitride of the third layer may include one of tantalum, tungsten, hafnium, lutetium, iridium, molybdenum, and zirconium. Moreover, the third layer may be purely amorphous. In some embodiments, the third layer may have a breakdown voltage of between about 8 Volts and 12 Volts. In some embodiments, the third layer may have a breakdown voltage of about 10.5 Volts. Furthermore, the ternary metal-silicon nitride of the third layer may include between about 32% and 40% nitrogen by weight.

In some embodiments, the third layer may have a thickness of between about 2 nm and 10 nm. For example, the third layer may have a thickness of about 5 nm. In some embodiments, the third layer may have a sheet resistivity of between about 5 Ohms-cm and 10 Ohms-cm. The third layer may be operable as a diffusion barrier and may be configured to prevent the migration of one or more materials into the second layer. The second layer may include, at least in part, amorphous silicon oxide. Moreover, the first layer may include a layer of titanium nitride, and the fourth layer may include a layer of tantalum nitride.

Also disclosed herein are methods for forming nonvolatile memory elements. The methods may include forming a first layer on a substrate. The first layer may be operable as a bottom electrode. The methods may also include forming a second layer over the first layer. The second layer may be operable as a variable resistance layer configured to switch between at least a first resistive state and a second resistive state. The methods may further include forming a third layer over the second layer. In some embodiments, the third layer may have a substantially constant electrical resistivity and may include a ternary metal-silicon nitride having a ratio of metal to silicon that is between about 1:1 and 1:4. The methods may also include forming a fourth layer over the third layer. The fourth layer may be operable as a top electrode.

In some embodiments, forming the third layer may also include using a physical vapor deposition process with nitrogen gas to deposit a layer of material that includes, at least in part, silicon and one of tantalum, tungsten, hafnium, lutetium, iridium, molybdenum, and zirconium. Moreover, the physical vapor deposition process may include sputtering a tantalum silicon target. In some embodiments, forming the third layer may include using an atomic layer deposition process to deposit a layer of material that includes, at least in part, silicon and one of tantalum, tungsten, hafnium, lutetium, iridium, molybdenum, and zirconium.

Also disclosed herein are resistive switching nonvolatile memory elements that may include a substrate and a first layer formed on the substrate. The first layer may be operable as a bottom electrode. The resistive switching nonvolatile memory elements may also include a second layer formed over the first layer. The second layer may be operable as a variable resistance layer configured to switch between at least a first resistive state and a second resistive state. The resistive switching nonvolatile memory elements may also include a third layer formed over the second layer. In some embodiments, the third layer may have a substantially constant electrical resistivity. Furthermore, the third layer may include a ternary metal-silicon nitride having a ratio of metal to silicon that may be about 1:3, and having a breakdown voltage of about 10.5 Volts. The resistive switching nonvolatile memory elements may also include a fourth layer formed over the third layer. The fourth layer may be operable as a top electrode. In some embodiments, the ternary metal-silicon nitride of the third layer may include a metal of atomic weight that is greater than 100.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
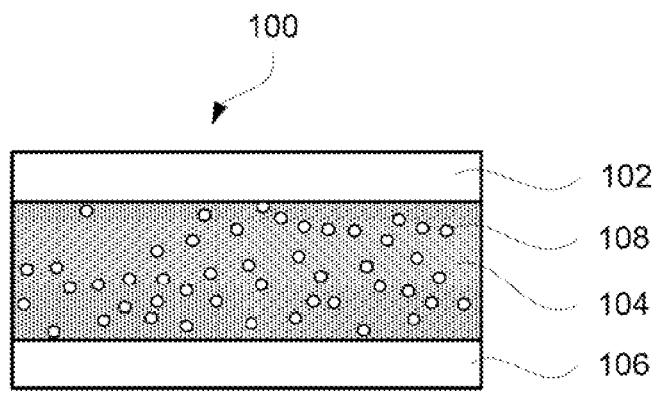
FIG. 1A illustrates a schematic representation of a ReRAM cell prior to an initial conductive-path forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the variable resistance layer is a dynamic process that is preferably well controlled to prevent over-programming. For example, when the variable resistance layer is switched from its high resistive state (HRS) to its low resistive state (LRS), a rapid drop in resistance associated with this switch may cause an excessive current through the variable resistance layer and an over-programming. The over-programming occurs when change in the resistance continues even after the variable resistance layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

To prevent current spiking and over-programming, an embedded resistor is connected in series with the variable resistance layer and is used to limit the current through the variable resistance layer. The embedded resistor effectively functions as a voltage divider within the ReRAM cell. Unlike the variable resistance layer, the embedded resistor maintains a constant resistance throughout the entire operation of the cell. As a relative change of the overall ReRAM cell resistance (expressed as a ratio of the change in the resistance of the ReRAM cell to the overall initial resistance) when the variable resistance layer goes between the LRS and the HRS is less for ReRAM cells with embedded resistors than for similar cells without embedded resistor. This voltage divider/constant resistance characteristic of the embedded resistor helps to prevent the current spiking and over-programming.

Accordingly, an embedded resistor may be used to limit an amplitude of an electrical current that passes through a memory element during operation of a resistive random access memory (ReRAM) cell. In contrast to the variable-resistance layer, the embedded resistor may be intended to maintain a substantially constant resistance throughout the operating life of the cell. Therefore, the formation of additional conductive paths, while desirable in a variable-resistance layer, may be undesirable in an embedded resistor because it would change the embedded resistor's resistance. Clustering of metal atoms within the material, tunneling, and breakdown are some of the mechanisms that can form conductive paths in an embedded resistor. In some embodiments, some mechanisms, such as clustering and tunneling, may be well controlled while other mechanisms, such as breakdown, are preferably discouraged to achieve a constant predictable resistance that is consistent from cell to cell.

Manufacturing constraints generally necessitate that the embedded resistor have a particular thickness and resistivity while tolerating high temperatures associated, for example, with activation of leakage-reduction elements. Conventional manufacturing processes are limited in their ability to form embedded resistors that have thinner thicknesses while also maintaining the high breakdown voltage and linear resistive characteristics required by the ReRAM cells. Typically, thinner embedded resistors have lower resistances and lower breakdown voltages due to the tunneling characteristics of the materials used.

ReRAM cells disclosed herein include embedded resistors that may be made of a ternary metal-silicon nitride. The ratio of metal-to-silicon may be configured to make the embedded resistor silicon rich, in which a ratio of metal to silicon may be between about 1:1 and 1:4. Without being restricted to any particular theory, it is believed that the increased silicon content of the embedded resistor passivates the metal included in the ternary metal-silicon nitride and reduces the tunneling that occurs during operation, thus allowing the embedded resistor to be thinner without reducing its resistance or breakdown voltage. Moreover, the metal of the ternary metal-silicon nitride may be a metal that has a relatively high atomic weight, such as tantalum, tungsten, hafnium, lutetium, iridium, molybdenum, and zirconium. The high atomic weight, such as greater than about 90 atomic weight, of the metal prevents the formation of metal filaments within the embedded resistor which may otherwise occur and result in breakdown of the embedded resistor. Metals having high atomic weights, such as greater than about 90, are less mobile in a silicon nitride environment and are less likely to form conductive filaments which may result in breakdown of the embedded resistor and may compromise the resistance of the embedded resistor. Moreover, the use of a metal with a high atomic weight may also reduce clustering and tunneling, thus providing a sufficiently high constant resistance for the embedded resistor when deposited in relatively thin layers. Accordingly, various ReRAM cells disclosed herein may include embedded resistors that are silicon rich and include a metal having a high atomic weight.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the variable resistance layer and, in some embodiments, across one interface formed by the resistive switching voltage, when a switching voltage is applied to the layer.

FIG. 1A illustrates a schematic representation of ReRAM cell 100 including first electrode 102, second electrode 106, and variable resistance layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be a reactive electrode and act as a source and as a reservoir of defects for the variable resistance layer. That is, defects may travel through an interface formed by this electrode with the variable resistance layer (i.e., the reactive interface).

Variable resistance layer 104 may be initially formed from a dielectric material and later made to conduct through one or more conductive paths formed within the layer by applying first a forming voltage and then a switching voltage. To provide this resistive switching functionality, variable resistance layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Variable resistance layer 104 may include some defects 108. Additional defects 108 may be provided within first electrode 102 and may be later transferred to variable resistance layer 104 during the formation operation. In some embodiments, the variable resistance layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and variable resistance layer 104 during forming and/or switching operations.

Figure 1B:
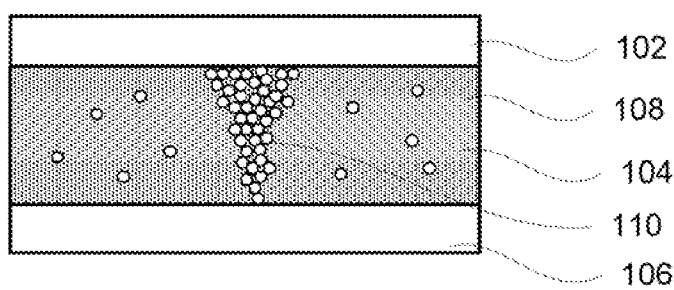
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within variable resistance layer 104 as, for example, schematically illustrated in FIG. 1B. Without being restricted to any particular theory, it is believed that defects 108 can be reoriented within variable resistance layer 104 to form these conductive paths as, for example, schematically shown in FIG. 1B. Furthermore, some or all defects 108 forming the conductive paths may enter variable resistance layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
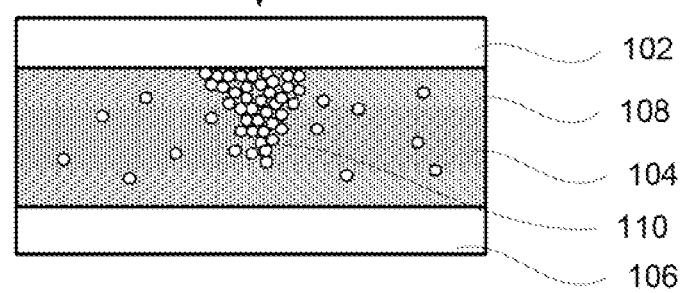

Resistive switching involves breaking and reforming conductive paths through variable resistance layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of variable resistance layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., variable resistance layer 104 has more conductive paths and/or less resistive conductive paths when it is in the LRS than when it is in the HRS. It should be noted that variable resistance layer 104 may still have some conductive paths while it is in the HRS, but these conductive paths are fewer and/or more resistive than the ones corresponding to the LRS.

When switching from its LRS to HRS, which is often referred to as a reset operation, variable resistance layer 104 may release some defects into first electrode 102. Furthermore, there may be some mobility of defects within variable resistance layer 104. This may lead to thinning and, in some embodiments, breakages of conductive paths as shown in FIG. 1C. Depending on mobility within variable resistance layer 104 and diffusion through the interface formed by variable resistance layer 104 and first electrode 102, the conductive paths may break closer to the interface with second electrode 106, somewhere within variable resistance layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, variable resistance layer 104 may receive some defects from first electrode 102. Similar to the reset operation described above, there may be some mobility of defects within variable resistance layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
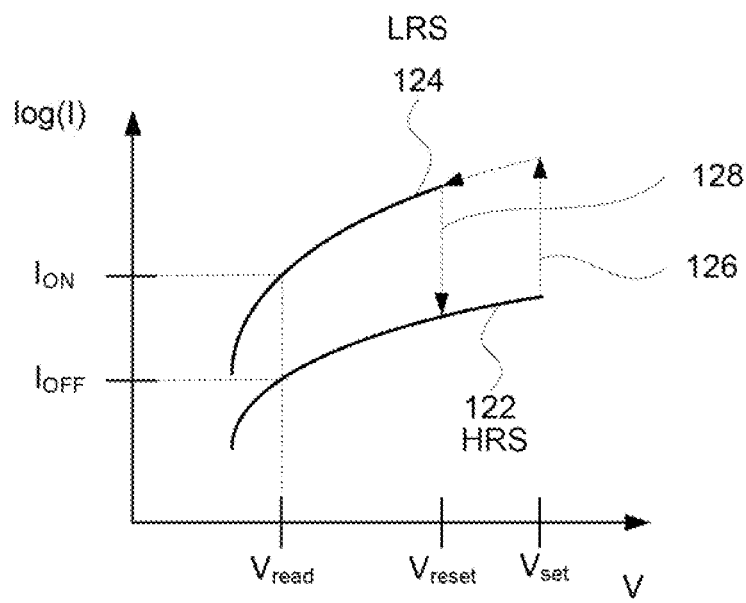
FIG. 2A illustrates a plot of a current passing through a unipolar ReRAM cell as a function of a voltage applied to the ReRAM cell, in accordance with some embodiments.
Figure 2B:
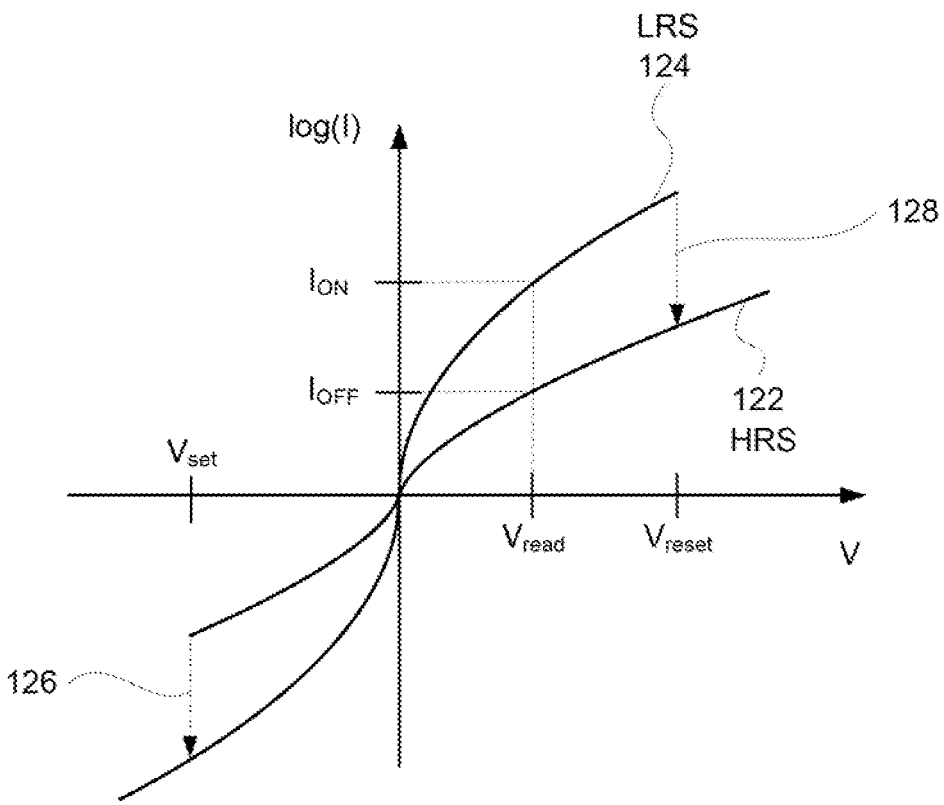
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of variable resistance layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the variable resistance layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the variable resistance layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

Examples of ReRAM Cells

Figure 3:
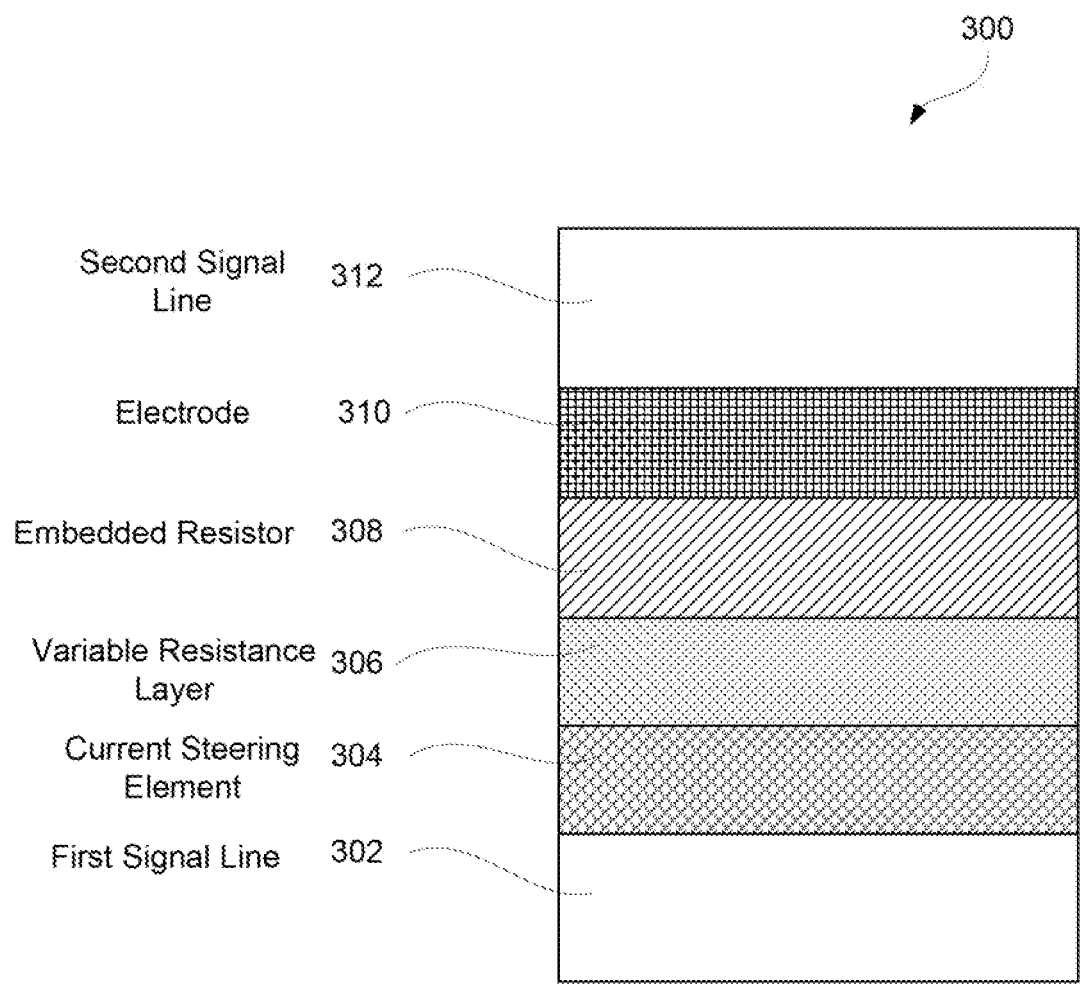
FIG. 3 illustrates a schematic representation of a ReRAM cell including an embedded resistor, variable resistance layer, and other components, in accordance with some embodiments.

FIG. 3 illustrates a schematic representation of a ReRAM cell 300, in accordance with some embodiments. ReRAM cell 300 may include a first signal line 302, a current steering element 304, a variable resistance layer 306, an embedded resistor 308, an intermediate electrode 310, and a second signal line 312. The "first" and "second" terminology is used herein only for differentiating reasons and does not imply any deposition order or spatial orientation of the layers unless specifically noted. In some embodiments, ReRAM cell 300 has more or fewer layers. For example, an intermediate layer may be disposed between electrode 310 and embedded resistor 308 in order to improve electrical connection between electrode 310 and embedded resistor 308. Furthermore, current steering element 304 and/or intermediate electrode 310 may be omitted from ReRAM cell 300. In some embodiments, embedded resistor 308 may directly interface variable resistance layer 306.

In the example illustrated in FIG. 3, a portion of current steering element 304 is also operable as another intermediate electrode interfacing variable resistance layer 306. Likewise, when intermediate electrode 310 is not present, a portion of embedded resistor 308 may be operable as an intermediate electrode. In some embodiments, variable resistance layer 306 is positioned in between and directly interfaces two designated electrodes. Regardless of these configurations one electrode (standalone or a part of another component) interfacing variable resistance layer 306 may be an inert electrode and may not exchange defects with variable resistance layer 306. Another electrode (standalone or a part of another component) that also interfaces variable resistance layer 306 may be active and may exchange defects with variable resistance layer 306. For example, a titanium nitride electrode may accept and release oxygen vacancies into variable resistance layer 306, while a doped polysilicon electrode may form a passivation silicon oxide layer that blocks defects from going in and out of variable resistance layer 306. In the example illustrated in FIG. 3, current steering element 304 may include a bottom p-doped polysilicon portion, which interfaces second signal line 302, a top n-doped polysilicon portion, which interfaces variable resistance layer 306 and is operable as an electrode, more specifically, an inert electrode.

In some embodiments, the electrodes may be sufficiently conductive to also be used as signal lines. Alternatively, signal lines and electrodes may be separate components as, for example, illustrated in FIG. 3. First signal line 302 and second signal line 312 provide electrical connections to ReRAM cell 300. For example, first signal line 302 and/or second signal line 312 extend between multiple ReRAM cells, which may be cells provided in the same row or the same column of a memory array as further described below with reference to FIGS. 5A and 5B. First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner electrodes may be formed using atomic layer deposition (ALD) techniques.

Current steering element 304, if one is present, may be an intervening electrical component, such as a p-n junction diode, p-i-n diode, transistor, or other similar device disposed between first signal line 302 and second signal line 312. As such, current steering element 304 is connected in series with variable resistance layer 306. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more nitrides. For example, current steering element 304 may be a layer of titanium nitride.

Variable resistance layer 306 can be fabricated from a dielectric material, such as a metal oxide material or other similar material that can be switched between two or more stable resistive states. In some embodiments, variable resistance layer 306 is fabricated from a silicon oxide. Accordingly, variable resistance layer 306 may be a layer of $SiO_2$ that is formed on and directly interfaces current steering element 304. Moreover, variable resistance layer 306 may have a thickness of between about 1 nm to about 100 nm, such as between about 2 nm and 20 nm or, more specifically, between about 5 nm and 10 nm. For example, variable resistance layer 306 may have a thickness of about 10 nm. Thinner variable resistance layers may be deposited using ALD, while thicker variable resistance layers may be deposited using may be deposited using ALD as well as physical vapor deposition (PVD) and, in some embodiments, chemical vapor deposition (CVD).

Embedded resistor 308 may be fabricated from a ternary metal-silicon nitride. In some embodiments, the use of a ternary metal silicon nitride as disclosed herein may result in better breakdown voltage characteristics of embedded resistor 308 than conventional embedded resistors formed from a metal nitride that does not include silicon or other materials as disclosed herein. Accordingly, embedded resistor 308 may have a breakdown voltage that is substantially higher than a forming voltage that may be applied to ReRAM cell 300. For example, a forming voltage of between about 5 Volts to 7 Volts may be applied to ReRAM cell 300. In some embodiments, embedded resistor 308 may be configured to have a breakdown voltage of between about 8 Volts and 12 Volts. For example, embedded resistor 308 may have a breakdown voltage of about 10.5 Volts. This type of embedded resistor will not break down when the forming voltage is applied to the ReRAM cell to form one or more conductive paths in the variable-resistance layer. Without the extra degree of unpredictability introduced by breakdown, the embedded resistor's operating resistance is expected to be more predictable over its operating life (i.e., the as-fabricated resistance of the material) and more consistent from cell to cell. In this way, embedded resistor 308 may be configured to have a high breakdown voltage relative to other components of ReRAM cell 300, such as variable resistance layer 306, and may exhibit increased reliability over conventional ReRAM cells, while still meeting existing manufacturing constraints.

TABLE 1

| Film | Breakdown Voltage(V) |
| --- | --- |
| $(TaSi_2)N$ | 6.2 V |
| $(TaSi_3)N$ | 10.5 V |

In some embodiments, the ternary metal-silicon nitride may be silicon rich and may have a ratio of metal to silicon that is between about 1:1 and 1:4. Without being restricted to any particular theory, it is believed that the increased silicon content of the embedded resistor passivates the metal included in the ternary metal-silicon nitride. Thus, increasing the silicon content of embedded resistor 308 effectively increases the tunneling distance among metal clusters which may form within embedded resistor 308. Accordingly, embedded resistor may be thinner, while still maintaining a sufficient resistivity and high breakdown voltage for ReRAM cell 300. As shown in Table 1, a breakdown voltage of a material that includes tantalum and silicon may be substantially increased when the silicon content is increased. In this example, $(TaSi_2)N$ may have a breakdown voltage of 6.2 V, while $(TaSi_3)N$ has a substantially larger breakdown voltage of 10.5 Volts. In some embodiments, the ratio of metal to silicon may be configured or determined based on a conductivity of the metal included in the ternary metal-silicon nitride to achieve a particular target resistance. For example, a more conductive metal may be included in a lower proportion than a metal that is less conductive. In some embodiments, the ternary metal-silicon nitride included in embedded resistor 308 may have a ratio of metal to silicon that is less or equal to about 1:3. For example, embedded resistor 308 may include a ternary metal-silicon nitride that includes any of $TaSi_3N$, $TaSi_{2.5}N$, or $TaSi_2N$.

TABLE 2

| Element | Mass |
| --- | --- |
| Zr | 91.24 |
| Mo | 95.96 |
| Lu | 174.97 |
| Hf | 178.49 |
| Ta | 180.95 |
| W | 183.84 |
| Ir | 192.22 |

In some embodiments, the ternary metal-silicon nitride may include a metal that has an atomic weight that is greater than 90. Without being restricted to any particular theory, it is believed that the high atomic weight, such as greater than about 90, of the metal reduces the mobility of the metal within embedded resistor 308, and prevents breakdown of embedded resistor 308. Moreover, according to some embodiments, the use of a metal with a high atomic weight may reduce the clustering of metal within embedded resistor 308, thus effectively increasing the tunneling distance within embedded resistor 308. Metals with lesser atomic weights are more likely to form relatively large conductive clusters or islands of metal within conventional embedded resistor layers, and are also more likely to form conductive filaments which may result in breakdown of an embedded resistor. The use of metals with larger atomic weights decreases the formation of such large conductive clusters, thus effectively increasing the tunneling distance within embedded resistor 308, and also enabling increased passivation by the silicon. The use of metals with larger atomic weights also decreases the mobility of the metal included in embedded resistor 308, thus making embedded resistor 308 less susceptible to breakdown. As shown in Table 2, some suitable metals which may be included in the ternary metal-silicon nitride may include zirconium, molybdenum, lutetium, hafnium, tantalum, tungsten, and iridium. For example, the ternary metal-silicon nitride may be one of hafnium silicon nitride, tantalum silicon nitride, and tungsten silicon nitride.

Accordingly, in some embodiments, embedded resistor 308 has a thickness of between about 2 nm and 10 nm. More specifically, embedded resistor 308 may have a thickness of about 5 nm. In some embodiments, embedded resistor 308 may have a thickness sufficient to enable embedded resistor 308 to be operable as a diffusion barrier that may prevent the migration of one or more materials into variable resistance layer 306. Moreover, a footprint (i.e., cross-sectional area) of embedded resistor 308 may be between about 20 nanometers-square and 100 nanometers-square or, more specifically, between about 30 nanometers-square and 60 nanometers-square, such as about 60 nanometers-square. In some embodiments, embedded resistor 308 may have a sheet resistivity of between about 5 Ohms-cm and 10 Ohms-cm.

In some embodiments, the ternary metal-silicon nitride included in embedded resistor 308 is purely amorphous. According to some embodiments, amorphous materials are less susceptible to breakdown than crystalline materials and are more stable during operation of ReRAM cell 300. Moreover, the ternary metal-silicon nitride included in embedded resistor 308 may be configured to remain amorphous even if it is subsequently subjected to an anneal process which may include heating ReRAM cell 300 at a temperature of 750 degrees Celsius.

As similarly stated above, embedded resistor 308 may include a ternary metal-silicon nitride. In some embodiments, when such a nitride is included in embedded resistor 308, an amount of nitrogen included in embedded resistor 308 may be sufficient to achieve charge neutrality of embedded resistor 308. In some embodiments, a nitrogen content of the ternary metal-silicon nitride may be between about 32% and 40% nitrogen by weight. Moreover, while some embodiments described herein have been described as including a ternary metal-silicon nitride, other elements may be used instead of silicon, such as boron and aluminum. For example, embedded resistor 308 may include a ternary metal-boron nitride or a ternary metal-aluminum nitride.

Electrode 310 may be fabricated from a conductive material that has a desirable conductivity and work function, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrode 310 may be formed from titanium, tantalum, or aluminum. Electrode 310 may be between about 5 nm and about 500 nm thick or, more specifically, between about 10 nm and about 100 nm thick.

Processing Examples

Figure 4:
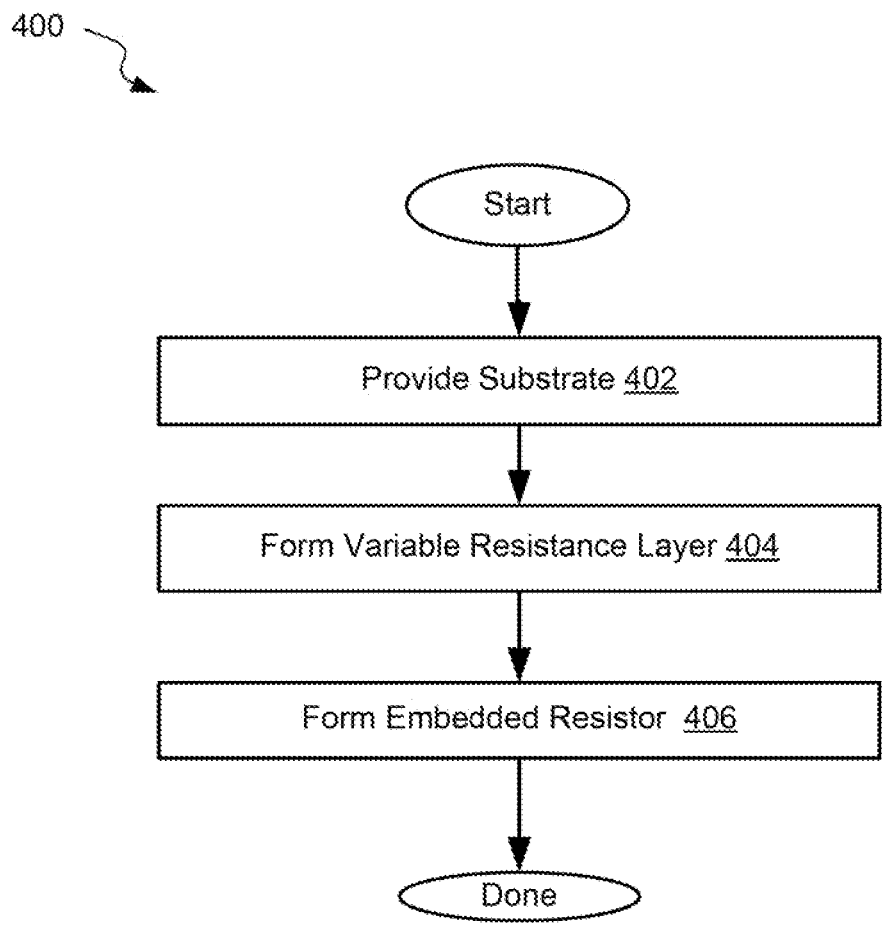
FIG. 4 illustrates a process flowchart corresponding to a method of fabricating a ReRAM cell, in accordance with some embodiments.

FIG. 4 illustrates a process flowchart corresponding to method 400 of fabricating a ReRAM cell, in accordance with some embodiments. Method 400 may commence with providing a substrate during operation 402. The substrate may include one or more components, such as a first signal line, a first electrode, and a current steering element. In other embodiments, method 400 involves forming the first signal line, the first electrode, and/or, for example, the current steering element on the substrate. The signal line can be made of silicon (e.g., doped polysilicon), a silicide, titanium nitride, or other appropriate materials listed elsewhere in this document. For example, a titanium nitride layer may be formed using physical vapor deposition (PVD) or other suitable deposition techniques. Deposition of the titanium nitride layer may be performed using a titanium target in a nitrogen atmosphere maintained at a pressure of between about 1-20 millitorr. A deposition rate of about 0.05-0.5 nm per second may be used. These process parameters are provided as examples and generally depend on deposited materials, tools, deposition rates, and other factors. Other processing techniques, such as atomic layer deposition (ALD), pulsed laser deposition (PLD), chemical vapor deposition (CVD), evaporation, and the like can also be used to deposit the first signal line and, in some embodiments, the current steering element.

Method 400 may proceed with forming a variable resistance layer during operation 404. The variable resistance layer may be formed directly over the substrate or current steering element, if included. Thus, the variable resistance layer may directly interface the current steering element. In some embodiments, the embedded resistor may or may not be separated by one or more other layer, e.g., an interface layer that prevents diffusion of materials between the embedded resistor and the variable resistance layer. As similarly discussed above, the variable resistance layer may include a material, such as silicon oxide, and may have a thickness of about 1 nm. Any suitable deposition technique may be used to form the variable resistance layer, such as an atomic layer deposition (ALD) process or a physical vapor deposition (PVD) process. Other processing techniques, such as PLD, CVD, evaporation, and the like may also be used to deposit the variable resistance layer.

Method 400 may proceed with forming an embedded resistor during operation 406. Various examples of embedded resistors are described above with reference to FIG. 3. In some embodiments, the embedded resistor may be formed from a ternary metal-silicon nitride. For example, the ternary metal-silicon nitride may include at least one or tantalum, tungsten, hafnium, lutetium, iridium, molybdenum, and zirconium. As previously discussed, a ratio of each element in these materials may be specifically tailored to achieve desirable properties of the embedded resistor. For example, the ternary metal-silicon nitride included in the embedded resistor may have a ratio of metal to silicon that is between about 1:1 and 1:4. Moreover, the ternary metal-silicon nitride may include a metal that has an atomic weight that is greater than 90. Furthermore, the embedded resistor may have a thickness of between about 5-10 nm.

Operation 406 may involve any suitable deposition or fabrication technique. For example, operation 406 may include using a physical vapor deposition process to deposit a layer of material that includes, at least in part, silicon and one of tantalum, tungsten, hafnium, lutetium, iridium, molybdenum, and zirconium. Moreover, the PVD process may be performed in a nitrogen environment that includes nitrogen gas. In one example, the PVD process may include sputtering a tantalum silicon target in a nitrogen gas containing environment. In another example, an atomic layer deposition process may be used to deposit a layer of material that includes, at least in part, silicon and one of tantalum, tungsten, hafnium, lutetium, iridium, molybdenum, and zirconium.

Memory Array Examples

Figure 5A:
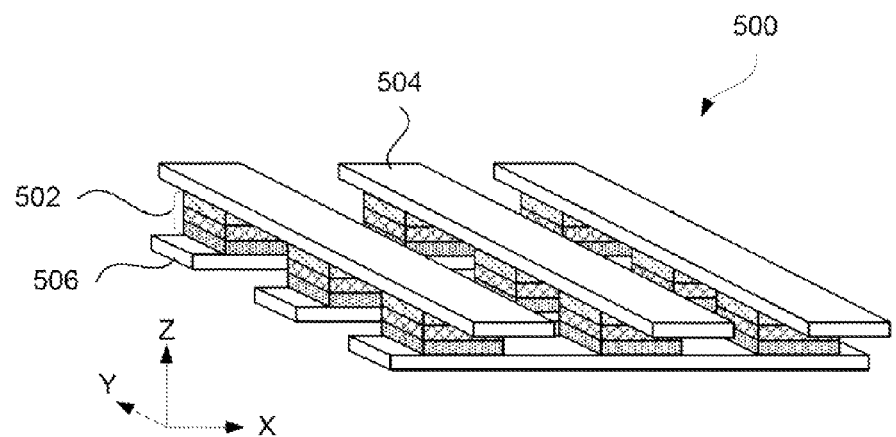
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, variable resistance layer, embedded resistors, embedded current steering elements, and the like, some of which are further described elsewhere in this document. In some embodiments, a ReRAM cell includes multiple variable resistance layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
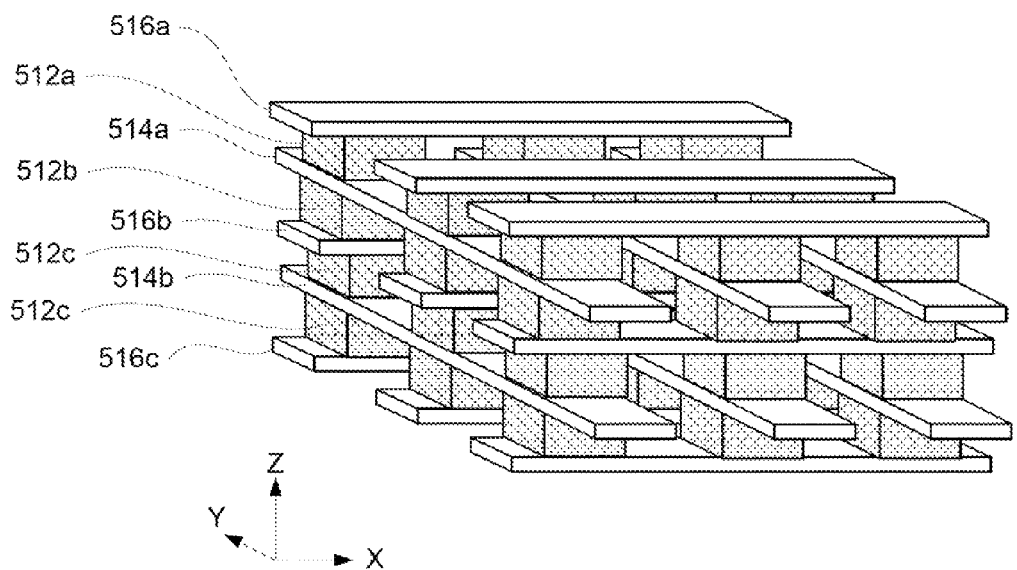

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive switching nonvolatile memory element comprising:
    a first layer formed on a substrate,
        wherein the first layer is operable as a bottom electrode;
    a second layer formed over the first layer,
        wherein the second layer is operable as a variable resistance layer configured to switch between at least a first resistive state and a second resistive state;
    a third layer formed over the second layer,
        wherein the third layer has a substantially constant electrical resistivity, and
        wherein the third layer comprises a ternary metal-silicon nitride having a ratio of metal to silicon that is between about 1:1 and 1:4,
        wherein the ternary metal-silicon nitride of the third layer comprises lutetium; and
    a fourth layer formed over the third layer, wherein the fourth layer is operable as a top electrode.

2. The nonvolatile memory element of claim 1, wherein the ratio of metal to silicon is about 1:3.

3. The nonvolatile memory element of claim 1, wherein the third layer is purely amorphous.

4. The nonvolatile memory element of claim 1, wherein the third layer has a breakdown voltage of between about 8 Volts and 12 Volts.

5. The nonvolatile memory element of claim 4, wherein the third layer has a breakdown voltage of about 10.5 Volts.

6. The nonvolatile memory element of claim 1, wherein the ternary metal-silicon nitride of the third layer comprises between about 32% and 40% nitrogen by weight.

7. The nonvolatile memory element of claim 1, wherein the third layer has a thickness of between about 2 nm and 10 nm.

8. The nonvolatile memory element of claim 7, wherein the third layer has a thickness of about 5 nm.

9. The nonvolatile memory element of claim 7, wherein the third layer has a sheet resistivity of between about 5 Ohms-cm and 10 Ohms-cm.

10. The nonvolatile memory element of claim 1, wherein the third layer is operable as a diffusion barrier and configured to prevent the migration of one or more materials into the second layer.

11. The nonvolatile memory element of claim 1, wherein the second layer comprises, at least in part, amorphous silicon oxide.

12. The nonvolatile memory element of claim 1, wherein the first layer comprises a layer of titanium nitride, and wherein the fourth layer comprises a layer of tantalum nitride.

13. A method for forming a nonvolatile memory element, the method comprising:
    forming a first layer on a substrate,
        wherein the first layer is operable as a bottom electrode;
    forming a second layer over the first layer,
        wherein the second layer is operable as a variable resistance layer configured to switch between at least a first resistive state and a second resistive state;
    forming a third layer over the second layer,
        wherein the third layer has a substantially constant resistivity, and
        wherein the third layer comprises a ternary metal-silicon nitride having a ratio of metal to silicon that is between about 1:1 and 1:4,
        wherein the ternary metal-silicon nitride of the third layer comprises lutetium; and
    forming a fourth layer over the third layer,
        wherein the fourth layer is operable as a top electrode.

14. The method of claim 13, wherein the forming of the third layer comprises:
    using a physical vapor deposition process with nitrogen.

15. The method of claim 13 wherein the forming of the third layer comprises:
    using an atomic layer deposition.

16. A resistive switching nonvolatile memory element comprising:
    a substrate;
    a first layer formed on the substrate,
        wherein the first layer is operable as a bottom electrode;
    a second layer formed over the first layer,
        wherein the second layer is operable as a variable resistance layer configured to switch between at least a first resistive state and a second resistive state;
    a third layer formed over the second layer,
        wherein the third layer has a substantially constant resistivity, and
        wherein the third layer comprises a ternary metal-silicon nitride having a ratio of metal to silicon that is about 1:3 and having a breakdown voltage of about 10.5 Volts, and
        wherein the ternary metal-silicon nitride of the third layer comprises lutetium; and
    a fourth layer formed over the third layer, wherein the fourth layer is operable as a top electrode.

* * * * *